United States Patent [19]

Atwood et al.

[11] Patent Number: 5,208,842
[45] Date of Patent: May 4, 1993

[54] PRECISION DIGITALLY-CONTROLLED VARIABLE ATTENUATION CIRCUIT

[75] Inventors: Kenneth L. Atwood; Hyun S. Kim; Kang M. Lee, all of Ridgecrest, Calif.

[73] Assignee: The United States of America as represented by the Secretary of the Navy, Washington, D.C.

[21] Appl. No.: 786,665

[22] Filed: Nov. 1, 1991

[51] Int. Cl.[5] .................... H01C 13/00; H03K 21/02
[52] U.S. Cl. ........................................ 377/55; 377/45; 307/296.6; 307/540; 323/354; 338/334
[58] Field of Search .................... 377/45, 55; 338/334; 307/296.6, 494, 491, 540; 323/354

[56] References Cited

U.S. PATENT DOCUMENTS

| | | | |
|---|---|---|---|
| 4,176,344 | 11/1979 | Saari et al. | 307/296.6 |
| 4,475,086 | 10/1984 | Allen | 377/45 |
| 4,558,231 | 12/1985 | Edwards | 377/45 |
| 4,583,009 | 4/1986 | Eng | 307/491 |
| 4,702,141 | 10/1987 | Dunanno | 84/626 |
| 4,810,949 | 3/1989 | Schiemenz et al. | 307/540 |
| 5,045,832 | 9/1991 | Tam | 338/334 |
| 5,085,526 | 2/1992 | Sawtell et al. | 307/310 |

Primary Examiner—John S. Heyman
Attorney, Agent, or Firm—Harvey A. Gilbert; Melvin J. Sliwka; John L. Forrest, Jr.

[57] ABSTRACT

A precise digitally-controlled variable attenuation circuit for adjusting the attenuation of a signal in an external circuit includes a signal magnitude detector, a resistance adjustment control, and a resistance divider network. The signal magnitude detector has lower and upper threshold limits representing a desired range of attenuation and is operable to receive and compare a control signal with the lower and upper threshold limits, and, in response thereto, produce either a first signal if the control signal is less than the lower threshold limit or a second signal if the control signal is greater than the upper threshold limit. The adjustment control is capable of receiving the first and second signals and is operable to produce either a digital count-down signal in response to the first signal or a digital count-up signal in response to the second signal. The resistance divider network has a fixed resistance and a digitally-adjustable device with a variable resistance. The fixed resistance is connected between a pair of terminals of an external circuit between which a signal is applied. The variable resistance is connected between one of the terminals of the external circuit and the adjustment control. The digitally-adjustable device will increase or decrease its variable resistance, and thereby correspondingly decrease or increase the attenuation by the divider network of the signal of the external circuit, in response to receiving respectively the digital count-up or count-down signal from the adjustment control.

20 Claims, 3 Drawing Sheets

PRECISION DIGITALLY-CONTROLLED VARIABLE ATTENUATION CIRCUIT

BACKGROUND OF THE INVENTION

1. Field of the Invention

The present invention generally relates to the attenuation of signals and, more particularly, to a precision digitally-controlled variable attenuation circuit for adjusting the attenuation of a signal in an external circuit, such as in an automatic gain control (AGC) loop.

2. Description of the Prior Art

Certain military applications, such as equipment for testing circuits in missiles under development by the Department of the Navy, require precise automatic gain control (AGC) loops. The AGC loops in this test equipment utilizes variable attenuation circuits. Up to the present time, variable attenuation circuits available on the commercial market have been used for this application.

However, these commercial variable attenuation circuits are totally analog and not very precise and thus do not achieve the precision attenuation needed in the AGC loops for this application. Thus, a need exists for a variable attenuation circuit capable of providing more precision.

SUMMARY OF THE INVENTION

The present invention provides a precision digitally-controlled variable attenuation circuit designed to satisfy the aforementioned need. The variable attenuation circuit of the present invention utilizes a variable potentiometer that can be digitally-adjusted to provide precise incremental resistance trimming to achieve a more precise, linear range of adjustment of attenuation than was the case with prior art analog variable attenuation circuits. The precision digitally-controlled variable attenuation circuit of the present invention can be implemented as a hybrid microcircuit which would be useful in all areas in which analog variable attenuation circuits are used.

Accordingly, the present invention is directed to a precision digitally-controlled variable attenuation circuit for adjusting the attenuation of a signal in an external circuit. The variable attenuation circuit comprises a signal magnitude detector, a resistance adjustment control, and a resistance divider network.

The signal magnitude detector has lower and upper threshold limits representing a desired range of attenuation and is operable to receive and compare a control signal with the lower and upper threshold limits. In response to such comparison, the detector will produce either (i) a first signal if the magnitude of the control signal is less than the lower threshold limit or (ii) a second signal if the magnitude of the control signal is greater than the upper threshold limit.

The resistance adjustment control is connected to the signal magnitude detector for receiving the first and second signals therefrom. The adjustment control is operable to produce either (i) a first digital signal in response to receiving the first signal or (ii) a second digital signal in response to receiving the second signal.

The resistance divider network has a fixed resistance and a digitally-adjustable device with a variable resistance. The fixed resistance is connected between a pair of terminals of an external circuit for receiving a signal applied between the terminals thereof. The variable resistance of the digitally-adjustable device is connected between one of the terminals of the external circuit and the adjustment control. The digitally-adjustable device is operable to increase or decrease the magnitude of the variable resistance and thereby correspondingly decrease or increase the attenuation of the signal of the external circuit by the divider network, in response to receiving respectively the first or second digital signal from the adjustment control.

More particularly, the signal magnitude detector includes first and second comparators, each having an output terminal and positive and negative input terminals. The first comparator receives a reference signal at the negative input terminal thereof to define the lower threshold limit of the detector. The first comparator receives the control signal at the positive input terminal thereof and is operable to compare the control signal with the lower threshold limit and to produce at the output terminal thereof (i) the first signal at a first state if the control signal received is less in magnitude than the lower threshold limit or (ii) the first signal at a second state if the control signal received is greater in magnitude than the lower threshold limit.

The second comparator receives a reference signal at the positive input terminal thereof to define the upper threshold limit of the detector. The second comparator receives the control signal at the negative input terminal thereof and is operable to compare the control signal with the upper threshold limit and to produce at the output terminal thereof (i) the second signal at the first state if the control signal received is greater in magnitude than the upper threshold limit or (ii) a second signal at the second state if the control signal received is less in magnitude than the upper threshold limit.

Also, the resistance adjustment control includes an up/down counter having an output terminal and a pair of count-down and count-up input terminals connected respectively to the output terminals of the first and second comparators. The up/down counter is operable to produce a digital count-up signal in response to receiving at its count-down input terminal the first signal at the first state from the first comparator and at its count-up input terminal the second signal at the second state from the second comparator. The digital count-up signal produced by the up/down counter contains a number of counts being proportional to the magnitude by which the control signal is less than the lower threshold limit of the detector.

The up/down counter is further operable to produce a digital count-down signal in response to receiving at its count-down input terminal the first signal at the second state from the first comparator and at its count-up input terminal the second output signal of the first state from the second comparator. The digital count-down signal produced by the up/down counter contains a number of counts being proportional to the magnitude by which the control signal is greater than the upper threshold limit of the detector.

Further, the digitally-adjustable device of the divider network has an input connected to the output of the up/down counter for receiving either the digital count-up signal or the digital count-down signal therefrom. The digitally-adjustable device of the divider network is operable to correspondingly increase or decrease the magnitude of the adjustable resistance by a number of increments corresponding to the number of counts contained in respective digital count-up or count-down signal and thereby correspondingly decrease or increase the attenuation by the divider network of the signal of the external circuit, in response to receiving the respective digital count-up or count-down signal from the adjustment control.

Furthermore, the magnitude detector is operable to produce a third signal if the magnitude of the control signal is between the lower and upper threshold limits. Also, the adjustment control is capable of receiving the third signal and is operable to produce neither the digital count-up nor count-down signal but instead clear the adjustment control to a starting count in response to the third signal. The digitally-adjustable device of the divider network is operable to maintain unchanged the magnitude of the variable resistance, and thereby correspondingly maintain unchanged the attenuation by the divider network of the signal of the external circuit, in response to receiving neither the digital count-up signal nor count-down signal from the adjustment control.

Also, the magnitude detector includes a logic network which interconnects the output terminals of the first and second comparators respectively with the count-down and count-up input terminals and a clear terminal of the up/down counter. The magnitude detector also includes an oscillator for clocking the first and second output signals from the output terminals of the first and second comparators to the respective count-down and count-up input terminals of the up/down counter.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description reference will be made to the attached drawings in which.

DETAILED DESCRIPTION OF THE INVENTION

Figure 1:
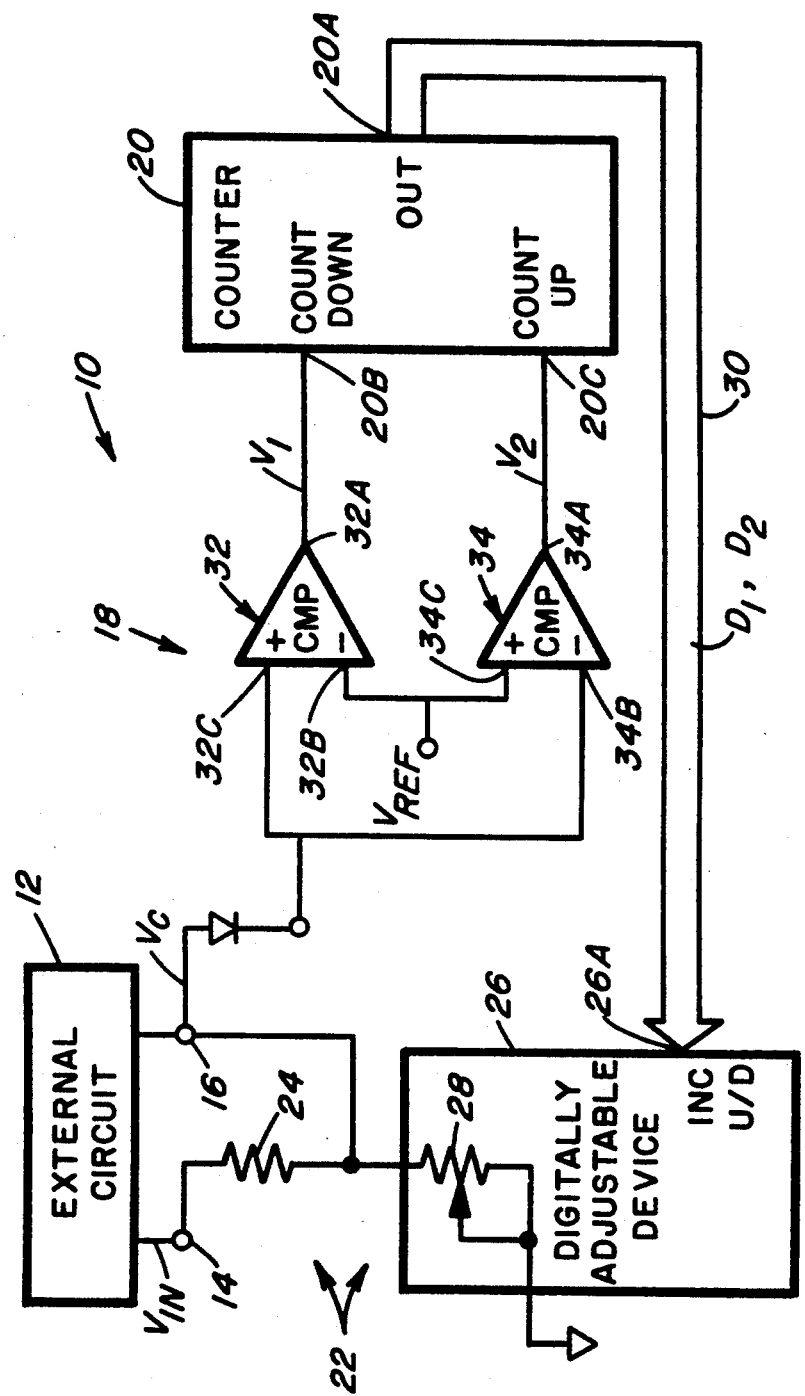
FIG. 1 is a general diagram of a precision digitally-controlled variable attenuation circuit of the present invention.

Referring now to the drawings, and particularly to the general diagram of FIG. 1, there is shown a precision digitally-controlled variable attenuation circuit of the present invention, being generally designated by the numeral 10. The variable attenuation circuit 10 can be used to adjust the attenuation of a signal in an external circuit 12. In the example shown in FIG. 1, the variable attenuation circuit 10 is employed to attenuate a voltage signal $V_{in}$ applied between a pair of terminals 14, 16 of an automatic gain control (AGC) loop 12.

Basically, the digitally-controlled variable attenuation circuit 10 includes a signal magnitude detector 18, a resistance adjustment control 20, and a resistance divider network 22. The signal magnitude detector 18 of the variable attenuation circuit 10 is preset with values LT and UT (FIG. 2) representing the lower and upper threshold limits of a desired window, or range of magnitude, within which it is desired to maintain the attenuation of the voltage signal $V_{in}$ of the external AGC loop circuit 12. A reference voltage $V_{ref}$ is applied to the detector 18 in order to establish the upper and lower threshold limits LT, UT of the range of attenuation desired to be applied by the divider network 22 to the voltage signal $V_{in}$ of the external circuit 12.

Basically, the magnitude detector 18 is operable to receive and compare an attenuated control signal $V_c$ with the lower and upper threshold limits LT, UT. In response to such comparison, the detector 18 will produce either (i) a first signal $V_1$ if the magnitude of the control signal is less than the lower threshold limit LT or (ii) a second signal $V_2$ if the magnitude of the control signal is greater than the upper threshold limit UT. The adjustment control 20 is connected to the magnitude detector 18 to receive the first and second signals $V_1$, $V_2$ therefrom. The adjustment control 20 is operable to produce either (i) a first digital signal D in response to receiving the first signal $V_1$ or (ii) a second digital signal $D_2$ in response to receiving the second signal $V_2$.

The divider network 22 has a fixed resistance 24 and a digitally-adjustable device 26 with a variable resistance 28. The fixed resistance 24 is connected between the pair of terminals 14, 16 of the external AGC loop circuit 12 to receive the voltage signal $V_{in}$ applied between the terminals 14, 16. The variable resistance 28 of the digitally-adjustable device 26 is connected to the terminal 16 and to the adjustment control 20 via a bus 30. The digitally-adjustable device 26 is operable to increase or decrease the magnitude of the variable resistance 28 and thereby correspondingly decrease or increase the attenuation of the voltage signal $V_{in}$ of the external circuit 12 by the divider network 22, in response to receiving respectively the first or second digital signal $D_1$, $D_2$ from the adjustment control 20. In such manner, the voltage signal $V_{in}$ is divided down or attenuated by the divider network 22 to correspond to the attenuation range represented by the reference voltage $V_{ref}$ applied to the detector 18.

More particularly, as seen in FIG. 1, the signal magnitude detector 18 of the adjustable attenuation circuit 10 includes first and second comparators (CMP) 32 and 34. The adjustment control 20 is an up/down counter 20. The first and second comparators can be operational amplifiers commercially identified by the part designation LM 139. The up/down counter can be one commercially identified by the part designation HC193. Zener diodes can be employed to provide the reference signal $V_{ref}$ to supply the lower and upper threshold voltage limits LT, UT of the comparators 32, 34.

Each comparator 32, 34 has an output terminal 32A, 34A and a pair of input terminals 32B, 32C and 34B, 34C of negative and positive polarities. The first comparator 32 1 receives the reference signal $V_{ref}$ at the negative input terminal 32B to define the lower threshold limit LT of the detector 18. The second comparator 34 receives the reference signal $V_{ref}$ at the positive input terminal 34B to define the upper threshold limit UT of the detector 18.

The first comparator 32 receives the control signal $V_c$ at the positive input terminal 32C and is operable to compare the control signal $V_c$ with the lower threshold limit LT and to produce at the output terminal 32A either (i) the first signal $V_1$ at a first state if the control signal $V_c$ is less in magnitude than the lower threshold limit LT or (ii) the first signal $V_1$ at a second state if the control signal $V_c$ is greater in magnitude than the lower threshold limit LT.

The second comparator 34 receives the control signal $V_c$ at the negative input terminal 34B and is operable to compare the control signal $V_c$ with the upper threshold limit UT and to produce at the output terminal 34A either (i) the second signal $V_2$ at the first state if the control signal $V_c$ is greater in magnitude than the upper threshold limit UT or (ii) the second signal $V_2$ at the second state if the control signal $V_c$ is less in magnitude than the upper threshold limit UT.

The up/down counter 20 has an output terminal 20A, a pair of count-down and count-up input terminals 20B, 20C, and a clear input terminal 20D. The count-down and count-up input terminals 20B, 20C are connected respectively to the output terminals 32A, 34A of the first and second comparators 32, 34. The up/down counter 20 is operable to produce the first digital signal, or a digital count-up signal, $D_1$ in response to receiving at its count-down input terminal 20B the first signal $V_1$ at the first state from the first comparator 32 and at its count-up input terminal 20C the second signal $V_2$ at the second state from the second comparator 34. The digital count-up signal $D_1$ produced by the up/down counter 20 contains a number of counts being proportional to the magnitude by which the control signal $V_c$ is less than the lower threshold limit LT of the detector 18.

The up/down counter 20 is further operable to produce the second digital signal, or a digital count-down signal, $D_2$ in response to receiving at its count-down input terminal 20B the first signal $V_1$ at the second state from the first comparator 32 and at its count-up input terminal 20C the second signal $V_2$ of the first state from the second comparator 34. The digital count-down signal $D_2$ produced by the up/down counter 20 contains a number of counts being proportional to the magnitude by which the control signal $V_c$ is greater than the upper threshold limit UL of the detector 18.

The digitally-adjustable device 26 of the divider network 22 has an input 26A connected to the output 20A of the up/down counter 20 via the bus 30 for receiving either the digital count-up signal D1 or the digital count-down signal $D_2$ therefrom. The digitally-adjustable device 26 is operable to correspondingly increase or decrease the magnitude of the variable resistance 28 by a number of increments corresponding to the number of counts contained in respective digital count-up or count-down signal $D_1$, $D_2$ and thereby correspondingly decrease or increase the attenuation by the divider network 22 of the signal $V_{in}$ of the external circuit 12, in response to receiving the respective digital count-up or count-down signal $D_1$, $D_2$ from the adjustment control 20.

Preferably, the digitally-adjustable device 26 includes a plurality of digitally-controlled potentiometer modules, such as commercially available from Xicor, Inc. and commercially identified by the part designation X9MME. The modules are connected in series with one another. The resistance of the modules can be varied in precise increments in order to thereby adjust the variable resistance portion of the resistance divider network 22 and thereby adjust the attenuation of the signal $V_{in}$. The up/down counter 20 provides the digital count-up and count-down signals $D_1$, $D_2$ which contain the correct number of counts of the increments to use in adjusting the variable resistance 28 of the digitally-controlled device 26 of the resistance divider 22. In particular, an up/down control (U/P) input and an increment (INC) input of each of the potentiometer modules of the device 26 are adjusted.

Figure 2:
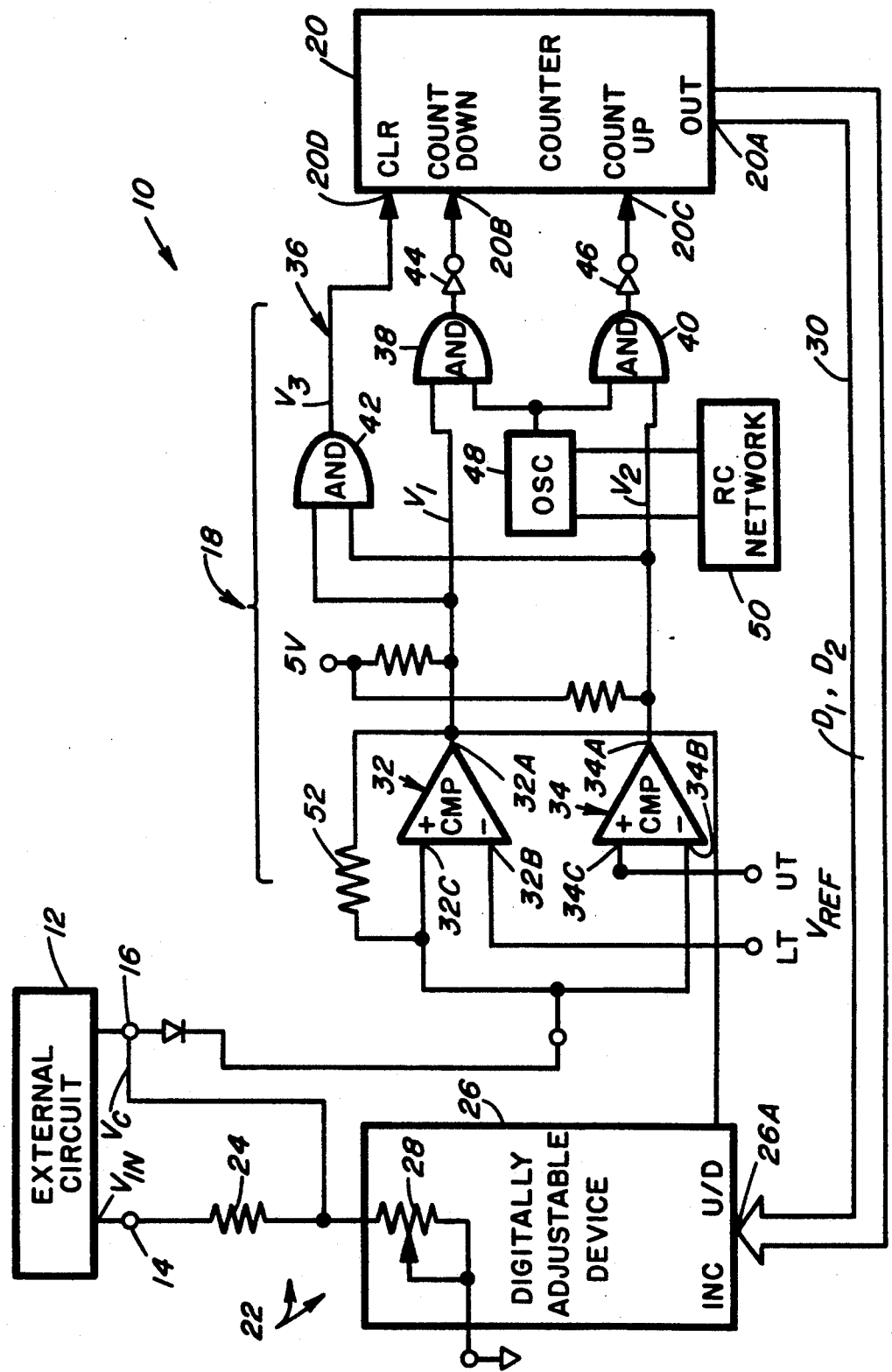
FIG. 2 is a more detailed diagram of the variable attenuation circuit of FIG. 1.

Referring to detailed diagram of FIG. 2, in addition to the first and second comparators 32, 34, the magnitude detector 18 of variable attenuation circuit 10 of the present invention also includes a logic network 36 interconnecting the comparators 32, 34 and the up/down counter 20. Specifically, a pair of AND gates 38, 40 of the logic network interconnect the output terminals 32A, 34A of the first and second comparators 32, 34 respectively with the count-down and count-up input terminals 20B, 20C of the up/down counter 20. Also a third AND gate 42 interconnects the output terminals 32A, 34A of the first and second comparators 32, 34 with the clear input terminal 20D of the counter 20. A pair of inverters 44, 46 are interposed respectively between the AND gates 40, 42 and the count-down and count-up input terminals 20B, 20C of the up/down counter 20.

The first and second comparators 32, 34 of the detector 18 are operable via the third AND gate 42 to produce a third signal $V_3$ if the magnitude of the control signal $V_c$ is between the lower and upper threshold limits LT, UT. The up/down counter 20 receives the third signal $V_3$ at its clear input terminal 20D. The counter 20 produces neither digital count-up nor count-down signal $D_1$, $D_2$, but instead resets or clears to a starting count, in response to the third signal $V_3$. The digitally-adjustable device 26 of the divider network 22 is operable to maintain unchanged the magnitude of the variable resistance 28, and thereby correspondingly maintain unchanged the attenuation of the signal $V_{in}$, in response to receiving neither the digital count-up signal $D_1$ nor count-down signal $D_2$ from the up/down counter 20.

The magnitude detector 18 also includes an oscillator 48, which can take the form of a square wave generator commercially identified by the part designation 555 timer. The oscillator 48 is operable to clock the first and second signals $V_1$, $V_2$ from the output- terminals 32A, 34A of the first and second comparators 32, 34 through the AND gates 38 and 40 respectively, to the respective count-down and count-up input terminals 20B, 20C of the up/down counter 20. The oscillator 48 has an external adjustable RC network 50 which permits its frequency to be adjusted to what is needed for the particular application.

Finally, the detector 18 also includes a feedback resistor 52 connected between the output terminal 32A and the positive input terminal 32C of the first comparator 32. The feedback resistor will cause hystersis and provide a window in which the counter 20 will not count.

TABLE I

| Control Signal compared to Threshold Limit | Comparator Output | State of Comparator Output | Counter Output Status |
|---|---|---|---|
| $V_c < V_{LT}$ | $V_1$ | L | no $D_2$ |
| $V_c < V_{LT}$ | $V_2$ | H | $D_1$ |
| $V_c < V_{LT}$ | $V_3$ | L | no clear |
| $V_{LT} < V_c < V_{UT}$ | $V_1$ | H | no $D_2$ |
| $V_{LT} < V_c < V_{UT}$ | $V_2$ | H | no $D_1$ |
| $V_{LT} < V_c < V_{UT}$ | $V_3$ | H | clear |
| $V_c > V_{UT}$ | $V_1$ | H | $D_2$ |
| $V_c > V_{UT}$ | $V_2$ | L | no $D_1$ |
| $V_c > V_{UT}$ | $V_3$ | L | no clear |

Table I above provides a functional description of the components of the variable attenuation circuit 10 of the present invention. When the control voltage signal $V_c$ is less than the lower threshold limit LT, the state of the first signal $V_1$ outputted by the first comparator 32 is low (L) and the state of the second signal $V_2$ outputted by the second comparator 34 is high (H), causing the counter 20 to count up producing the digital count-up signal $D_1$ which will increase the magitude of the variable resistance 28 of the digitally-adjustable device 26 and reduce the attenuation.

When the control voltage signal $V_c$ is greater than the upper threshold limit UT, the state of the first signal $V_1$ outputted by the first comparator 32 is high (H) and the state of the second signal $V_2$ outputted by the second comparator 34 is low (L), causing the counter 20 to count down producing the digital count-down signal $D_2$ which will decrease the magnitude of the variable resistance 28 of the digitally-adjustable device 26 and increase the attenuation.

When the control voltage signal $V_c$ is between the upper and lower threshold limits UT, LT, the states of the first and second signals $V_1$, $V_2$ are both high (H) and the state of the third signal $V_3$ from the AND gate 42 is also high (H), causing the counter 20 to only reset or clear its count. It will be observed that at other times the state of the third signal $V_3$ is low (L).

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

Figure 3:
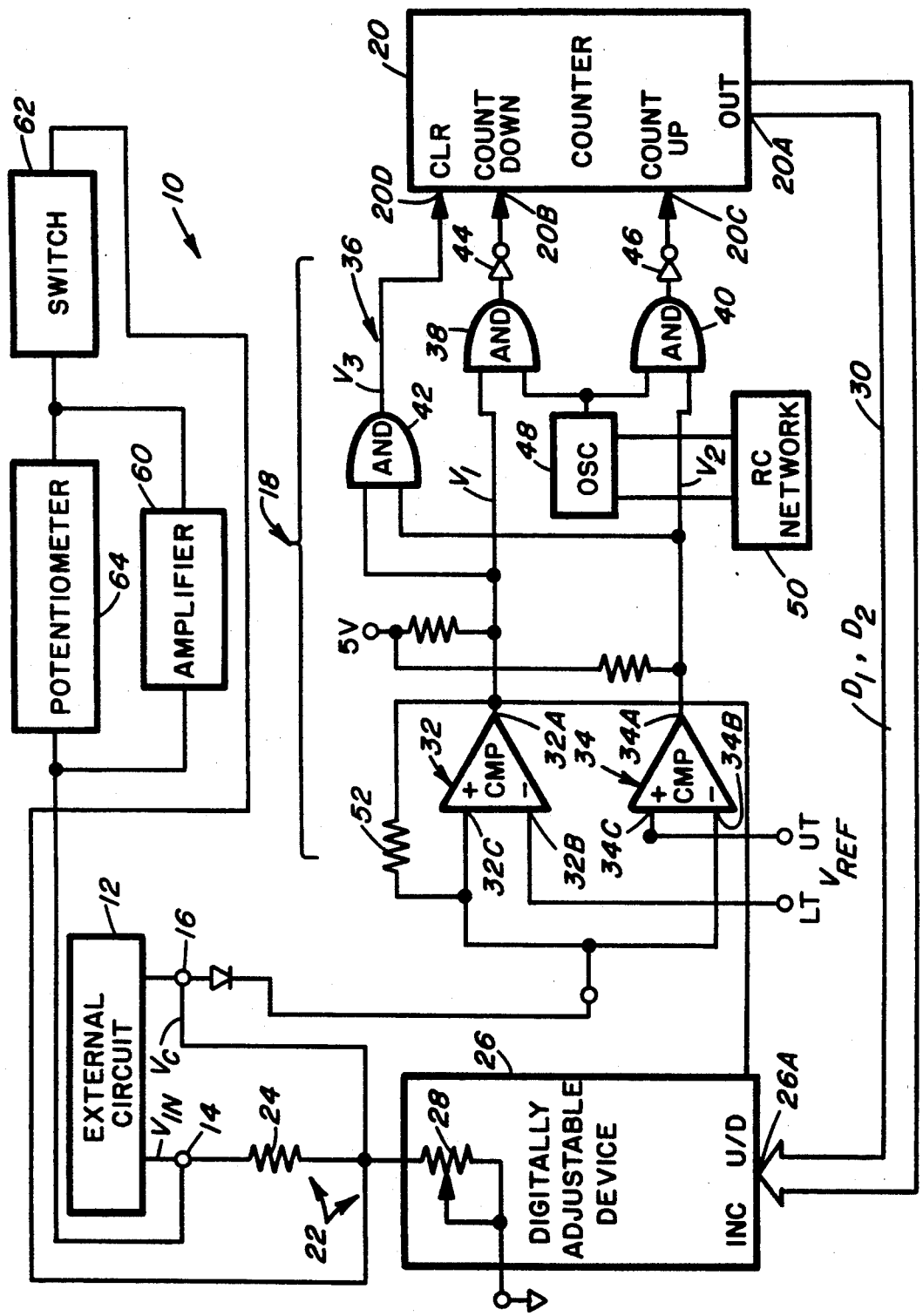

By way of example, if gain is required, the circuit of FIG. 3 may be used. An amplifier 60 is added to provide increased gain. The amplifier is only used if more gain is required and is switched into the circuit with analog switch 62. See FIG. 3. A digitally controlled potentiometer 64 controls the gain of the amplifier by counting up and adding resistance. More resistance gives more gain. Counting down decreases the gain.

Having thus described the invention, what is claimed is:

1. A precision digitally-controlled variable attenuation circuit for adjusting the attenuation of a signal in an external circuit, comprising:
   (a) a signal magnitude detector having lower and upper threshold limits representing a desired range of attenuation, said detector being operable to receive a control signal and compare it with said upper and lower threshold limits and, in response to such comparison, to produce either (i) a first signal if the magnitude of the control signal is less than the lower threshold limit or (ii) a second signal if the magnitude of the control signal is greater than the upper threshold limit;
   (b) a resistance adjustment control connected to said detector for receiving said first and second signal therefrom and being operable to produce either (i) a first digital signal in response to receiving said first signal or (ii) a second digital signal in response to receiving said second signal; and
   (c) a resistance divider network having a fixed resistance connected between a pair of terminals of an external circuit for receiving a signal applied therebetween, and a digitally-adjustable device with a variable resistance connected between one of the terminals of the external circuit and said adjustment control and being operable to increase or decrease the magnitude of said variable resistance, and thereby correspondingly decrease or increase the attenuation by said divider network of the signal of the external circuit, in response to receiving respectively said first or second digital signal from said adjustment control.

2. The circuit of claim 1 wherein said detector includes first and second comparators, each having an output terminal and positive and negative input terminals.

3. The circuit of claim 2 wherein:
   said first comparator is capable of receiving the control signal at said positive input terminal thereof and a reference signal at said negative input terminal thereof to define said lower threshold limit of said detector;
   said first comparator is operable to compare the control signal with said lower threshold limit and to produce at said output terminal thereof (i) said first signal at a first state if the control signal received is less in magnitude than said lower threshold limit or (ii) said first signal at a second state if the control signal received is greater in magnitude than said lower threshold limit.

4. The circuit of claim 3 wherein:
   said second comparator is capable of receiving the control signal at said negative input terminal thereof and a reference signal at said positive input terminal thereof to define said upper threshold limit of said detector;
   said second comparator is operable to compare the control signal with said upper threshold limit and to produce at said output terminal thereof (i) said second signal at said first state if the control signal received is greater in magnitude than said upper threshold limit or (ii) said second signal at said second state if the control signal is less in magnitude than said upper threshold limit.

5. The circuit of claim 4 wherein said adjustment control includes an up/down counter having an output terminal and a pair of count-down and count-up input terminals connected respectively to said output terminals of said first and second comparators.

6. The circuit of claim 5 wherein said up/down counter is operable to produce a digital count-up signal in response to receiving at said count-down input terminal said first signal at said first state from said first comparator and at said count-up input terminal said second signal at said second state from said second comparator, said digital count-up signal containing a number of counts being proportional to the magnitude by which the control signal is less than said lower threshold limit of said detector.

7. The circuit of claim 6 wherein said up/down counter is further operable to produce a digital count-down signal in response to receiving at said count-down input terminal said first signal at said second state from said first comparator and at said count-up input terminal said second signal at said first state from said second comparator, said digital count-down signal containing a number of counts being proportional to the magnitude by which the control signal is greater than said upper threshold limit of said detector.

8. The circuit of claim 7 wherein:
   said digitally-adjustable device of said divider network has an input connected to said output of said up/down counter for receiving either said digital count-up signal or said digital countdown signal therefrom;
   said digitally-adjustable device is operable to correspondingly increase or decrease the magnitude of said adjustable resistor by a number of increments corresponding to the number of counts contained in said respective digital count-up or count-down signal, and thereby correspondingly decrease or increase the attenuation by said divider network of the signal of the external circuit, in response to receiving said respective digital count-up or count-down signal from said adjustment control.

9. A precision digitally-controlled variable attenuation circuit for adjusting the attenuation of a signal in an external circuit, comprising:
   (a) a signal magnitude detector having lower and upper threshold limits representing a desired range of attenuation, said detector being operable to receive a control signal and compare it with said lower and upper threshold limits and, in response to such comparison, to produce either (i) a first signal if the magnitude of the control signal is less than said lower threshold limit, (ii) a second signal if the magnitude of the control signal is greater than said upper threshold limit, or (iii) a third signal if the magnitude of the control signal is between said upper and lower threshold limits;
   (b) a resistance adjustment control connected to said detector for receiving said first, second, and third signals therefrom and being operable to produce either (i) a first digital signal in response to receiving said first signal, (ii) a second digital signal in response to receiving said second signal, or (iii) no signal in response to receiving said third signal; and
   (c) a resistance divider network having a fixed resistance connected between a pair of terminals of an external circuit for receiving a signal applied therebetween, and a digitally-adjustable device with a variable resistance connected between one of the terminals of the external circuit and said adjustment control and being operable to increase, decrease, or maintain unchanged, the magnitude of said variable resistance, and thereby correspondingly decrease, increase, or maintain unchanged, the attenuation by said divider network of the signal of the external circuit, in response to respectively receiving said first digital signal, second digital signal, or neither of said digital signals, from said adjustment control.

10. The circuit of claim 9 wherein said detector includes first and second comparators, each having an output terminal and positive and negative input terminals.

11. The circuit of claim 10 wherein:
   said first comparator is capable of receiving the control signal at said positive input terminal thereof and a reference signal at said negative input terminal thereof to define said lower threshold limit of said detector;
   said first comparator is operable to compare the control signal with said lower threshold limit and to produce at said output terminal thereof (i) said first signal at a first state if the control signal is less in magnitude than said lower threshold limit or (ii) said first signal at a second state if the control signal is greater in magnitude than said lower threshold limit.

12. The circuit of claim 11 wherein:
   said second comparator is capable of receiving the control signal at said negative input terminal thereof and a reference signal at said positive input terminal thereof to define said upper threshold limit of said detector;
   said second comparator is operable to compare the control signal with said upper threshold limit and to produce at said output terminal thereof (i) said second signal at said first state if the control signal is greater in magnitude than said upper threshold limit or (ii) said second signal at said second state if the control signal is less in magnitude than said upper threshold limit.

13. The circuit of claim 12 wherein said adjustment control includes an up/down counter having an output terminal and a pair of count-down and count-up input terminals connected respectively to said output terminals of said first and second comparators.

14. The circuit of claim 13 wherein said up/down counter is operable to produce a digital count-up signal in response to receiving at said count-down input terminal said first output signal at said first state from said first comparator and at said count-up input terminal said second output signal at said second state from said second comparator, said digital count-up signal containing a number of counts being proportional to the magnitude by which the control signal is less than said lower threshold limit of said detector.

15. The circuit of claim 14 wherein said up/down counter is further operable to produce a digital count-down output signal in response to receiving at said count-down input terminal said first output signal at said second state from said first comparator and at said count-up input terminal said second output signal at said first state from said second comparator, said digital count-down signal containing a number of counts being proportional to the magnitude by which the control signal is greater than said upper threshold limit of said detector.

16. The circuit of claim 15 wherein:
   said digitally-adjustable device of said divider network has an input connected to said output of said counter for receiving said digital count-up signal or said digital count-down signal therefrom;
   said digitally-adjustable device is operable to correspondingly increase or decrease the magnitude of said adjustable resistor by a number of increments corresponding to the number of counts contained in said respective digital count-up or count-down signal, and thereby correspondingly decrease or increase the attenuation by said divider network of the signal of the external circuit, in response to receiving said respective digital count-up or count-down signal from said adjustment control.

17. The circuit of claim 15 wherein said detector further includes a logic network interconnecting respectively said output terminals of said first and second comparators to said count-down and count-up input terminals of said up/down counter.

18. The circuit of claim 17 wherein said logic network also interconnects said output terminals of said first and second comparators to a clear terminal of the up/down counter.

19. The circuit of claim 17 wherein said detector further includes an oscillator connected to said logic network for respectively clocking said first and second output signals from said output terminals of said first and second comparators to the said count-down and count-up input terminals of said up/down counter.

20. The circuit of claim 11 wherein said detector further includes a feedback resistor connected between said output terminal and said positive input terminal of said first comparator.

* * * * *